United States Patent [19]

Stormont et al.

[11] Patent Number: 4,992,736
[45] Date of Patent: Feb. 12, 1991

[54] RADIO FREQUENCY RECEIVER FOR A NMR INSTRUMENT

[75] Inventors: Robert S. Stormont, Waukesha; Michael C. Anas, Germantown; Norbert J. Pelc, Wauwatosa, all of Wis.

[73] Assignee: General Electric Company, Milwaukee, Wis.

[21] Appl. No.: 389,456

[22] Filed: Aug. 4, 1989

[51] Int. Cl.$^5$ ............................................. G01R 33/20
[52] U.S. Cl. ..................................................... 324/309
[58] Field of Search ...................... 455/60; 375/39, 75, 375/99, 103; 324/309, 310, 311, 312, 313, 314, 322; 318/611

[56] References Cited

U.S. PATENT DOCUMENTS

| | | | |
|---|---|---|---|
| 3,423,529 | 1/1969 | O'Neill, Jr. | 375/39 |
| 3,443,229 | 5/1969 | Becker | 375/39 |
| 3,522,537 | 8/1970 | Boughtwood | 375/39 |
| 4,740,753 | 4/1988 | Glover | 324/320 |
| 4,839,573 | 6/1989 | Wise | 318/611 |

Primary Examiner—Michael J. Tokar
Attorney, Agent, or Firm—Quarles & Brady

[57] ABSTRACT

A receiver processes an NMR signal to produce a baseband image information signal from which two quadrature component signals are derived. An intermediate frequency section mixes the received NMR signal with two reference signals to shift the image information into a frequency band having a bandwidth BW and centered at a frequency that is 1.5 times the bandwidth BW. The resultant signal is filtered to remove extraneous signals outside the image information band. An analog to digital converter samples the filtered signal at a rate that is twice the bandwidth BW and digitizes the samples into a digital signal. A quadrature detector derives I and Q output signals from the digital signal by alternately selecting digital samples and negating every other sample selected for each of the I and Q output signals. The quadature detector also digitally filters the I and Q signals which are then used to construct an NMR image.

16 Claims, 7 Drawing Sheets

RADIO FREQUENCY RECEIVER FOR A NMR INSTRUMENT

BACKGROUND OF THE INVENTION

The field of the invention is nuclear magnetic resonance (NMR) imaging methods and systems. More particularly, the invention relates to an RF synthesizer and transmitter for producing RF excitation pulses having a precise frequency and phase, and a receiver for accurately receiving, demodulating and digitizing the resulting NMR signals.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomenon are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_t$ is tipped, and hence, the magnitude of the net transverse magnetic moment $M_t$ depends primarily on the length of time and magnitude of the applied excitation field $B_1$ and its frequency.

The practical value of this phenomenon resides in the signal which is emitted by the excited spins after the excitation signal $B_1$ is terminated. In simple systems the excited nuclei induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T_2^*}$$

The decay constant $1/T_2^*$ depends on the homogeneity of the magnetic field and on $T_2$, which is referred to as the "spin-spin relaxation" constant, or the "transverse relaxation" constant. The $T_2$ constant is inversely proportional to the exponential rate at which the signal decays, at least in part due to a dephasing of the aligned precession of the spins after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest. If the net magnetic moment M is not given sufficient time to relax to its equilibrium value, the amplitude A of the NMR signal produced in a subsequent pulse sequence will be reduced.

The NMR measurements of particular relevance to the present invention are called "pulsed NMR measurements". Such NMR measurements are divided into a period of RF excitation and a period of signal emission and acquisition. These measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, frequency content, phase and duration. Such RF excitation pulses may have a narrow frequency spectrum (selective excitation pulse), or they may have a broad frequency spectrum (nonselective excitation pulse) which can produce transverse magnetization $M_t$ over a range of resonant frequencies. The prior art is replete with RF excitation techniques that are designed to take advantage of particular NMR phenomena and which overcome particular problems in the NMR measurement process.

After an excitation pulse, the NMR imaging system receives the radio frequency signals emitted by the excited nuclei and uses these signals to construct an image of the patient. The received signals containing "image information" lie in a band of frequencies centered at the Larmor frequency. Before the image information can be extracted to construct an image of the patient, this band of frequencies must be demodulated by shifting it to lower frequencies. Conventional signal conversion is employed to shift the band of frequencies by mixing the image information signal with a reference signal. Unless properly filtered out, noise in a band of frequencies that is symmetrical about the reference signal frequency with the image information band will become superimposed onto the image information in the resultant signal produced by the heterodyning.

This problem can be avoided if quadrature receivers are used to bring the image information to baseband. The use of in-phase (I) and quadrature (Q) demodulation allows frequencies on either side of a reference frequency to be distinguished, if the phase and amplitude adjustment of the I and Q signal channels is exact. Unfortunately such precise adjustment is difficult and misadjustment can cause some of the energy on one side of the reference frequency to be misassigned to the other side (poor "image" rejection). In addition, low frequency (e.g. 1/F) noise may be introduced into the image information signal and degrade its quality.

Heretofore, the signal processing that demodulated the image information and produced the two quadrature signals was performed in the analog domain. From a noise immunity standpoint, it is advantageous to convert the image information signal into the digital domain as early in the processing as possible. With the advent of high performance digital circuits and programmable signal processors, it is becoming possible to rapidly perform complex signal processing digitally.

SUMMARY OF THE INVENTION

A signal processor converts a received signal into two signals in quadrature which contain image information. The received signal is initially filtered to remove signals at frequencies other than those which contain desired information. The filtered signal is then heterodyned to down shift the band of information bearing frequencies to a band centered at a frequency which is 1.5 times the bandwidth of the information. The heterodyned signal preferably is filtered to remove the frequencies outside the information band, and then digitized by an analog to digital converter which samples the signal at a rate that is twice the bandwidth of the image information. The frequency relationship of the sampling rate to the signal bandwidth intentionally "aliases" the information carrying frequencies to lower ones.

Conventional quadrature signals are derived from the digital information signal. To do so, sine and cosine signals at one-half the signal bandwidth are combined with the digital information samples. To accomplish the quadrature detection in the digital domain, the sine and cosine signals must be digitized at the same sampling rate as was used by the analog to digital converter. This rate is four times the frequency of the sine and cosine signals. As a result of this frequency relationship, the numerical series of the digitized cosine and sine signals will be 1, 0, −1, 0, 1, 0, −1, 0, ... and 0, 1, 0, −1, 0, 1, 0, −1, 0, ..., respectively Since the quadrature detection involves multiplying the sine and cosine samples with the information samples, the products will either be zero, or plus or minus the information samples.

The quadrature detection is implemented by two digital signal processors which produce conventional I and Q quadrature signals. A pair of gates alternate passing the information samples to the signal processors. The I and Q signal samples are digitally filtered to remove any extraneous signals at non-information bearing frequencies and phase shift (or time delay) these signals to bring them into temporal alignment. The filtering also negates every other term in the series as such term should have been multiplied by a −1 sine or cosine value, which was not done by the signal gating.

An object of the present invention is to provide an apparatus which demodulates an NMR signal received from a patient to extract frequencies containing image information.

Another object is to convert the extracted information into two signals that are in quadrature for subsequent processing by a conventional array processor.

A further object is to perform the signal processing in a manner which minimizes the effects of noise and extraneous signal in the resultant information signal.

Yet another object of the present invention is to perform part of the demodulation and quadrature detection in the digital domain for improved thermal and "image" noise rejection.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
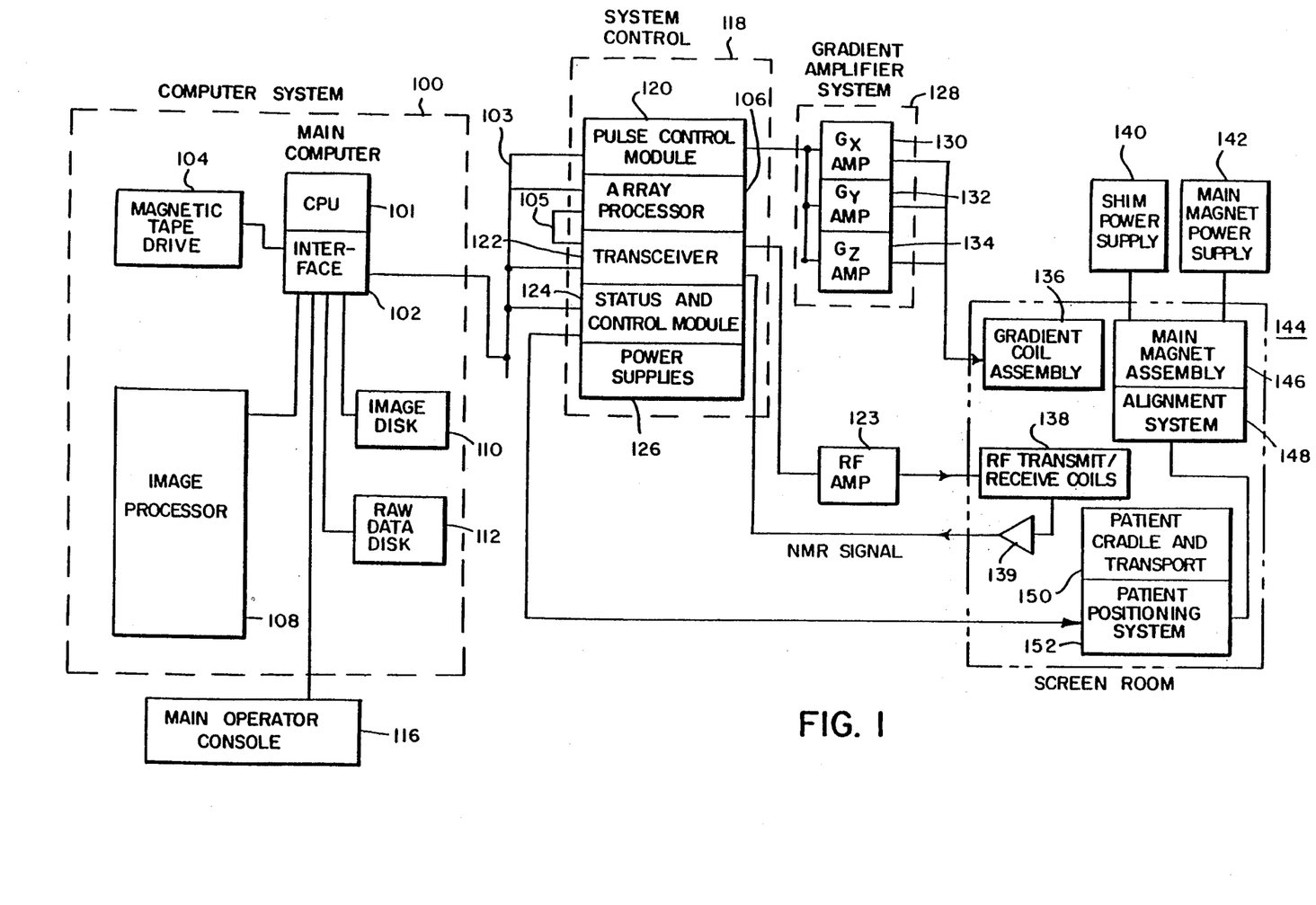
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV4000). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disk storage device designated 110. The function of image processor 108 is to provide interactive image display manipulation such as magnification, image comparison, gray-scale adjustment and real time data display. The computer system is provided with a means to store raw data (i.e. before image construction) utilizing a disk data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on disks or magnetic tape.

The computer system 100 exercises control over the NMR system by means of system control 118 and gradient amplifier system 128. The computer 100 communicates with system control 118 by means of a communication data link 103 in a manner well known to those skilled in the art. The communication data link 103 consists of a parallel data bus, a parallel address bus and a control signal bus. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively. Each amplifier 130, 132 and 134 is utilized to excite a corresponding gradient coil in an assembly generally designated 136 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by a main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_0 + G_x X + G_y Y + G_z Z$.

The gradient magnetic fields are utilized in combination with radio frequency pulses generated by transceiver 122, RF power amplifier 123 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and are coupled to the transceiver 122 by a preamplifier 139. The NMR signals are amplified, demodulated, filtered, and digitized in the receiver section of the transceiver 122. The processed NMR signals are transmitted to the array processor 106 for processing by means of a dedicated, unidirectional data link 105.

The PCM 120 and SCM 124 are independent subsystems both of which communicate with main computer 101, peripheral system, such as patient positioning system 152, as well as to one another by means of data communication link 103. The PCM 120 and SCM 124 are each comprised of a 16-bit microprocessor (such as Intel 8086) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coils associated with the main magnet and which are used to correct inhomogeneities in the polarizing magnetic field. In the case of a resistive magnet, a main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
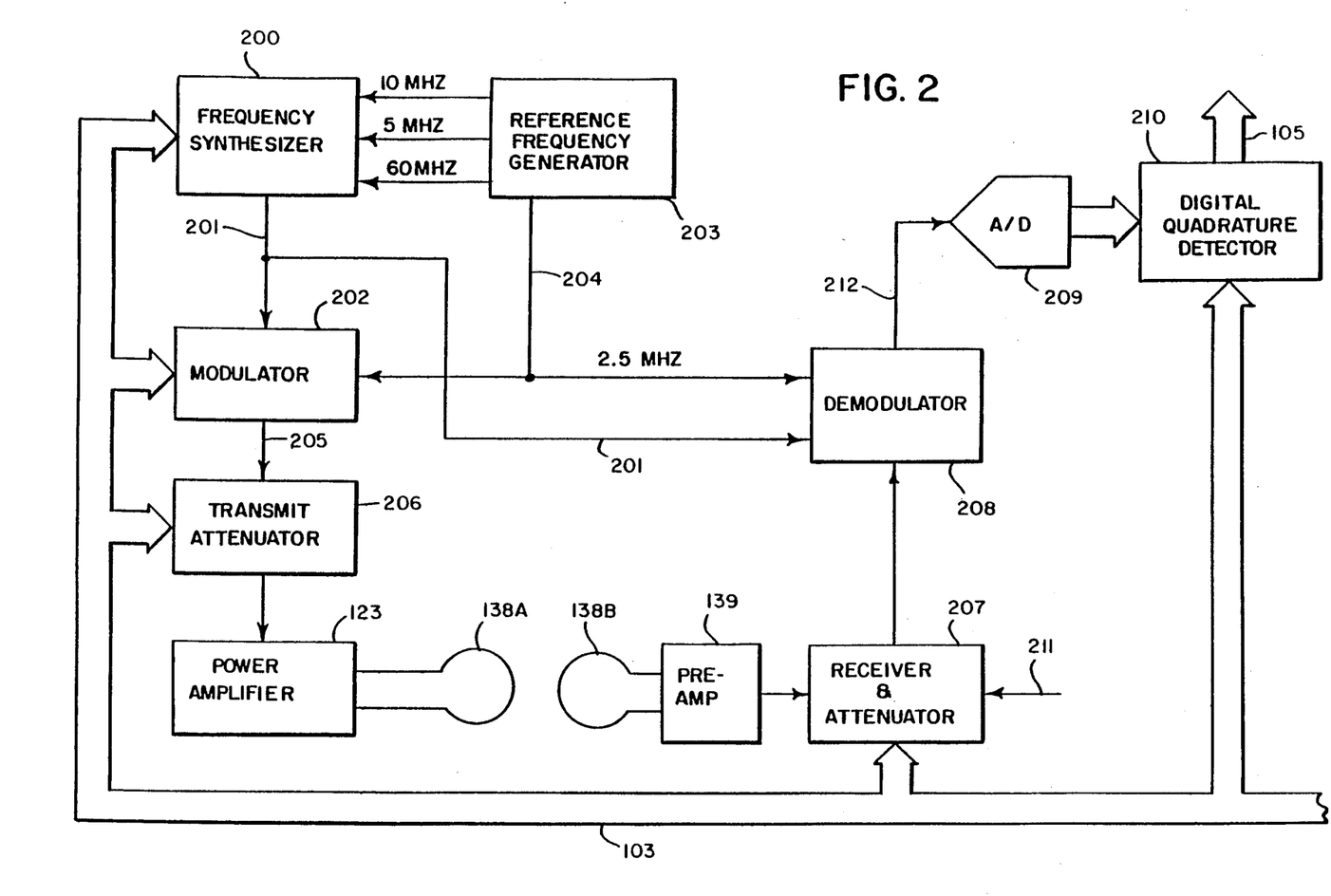
FIG. 2 is an electrical block diagram of the transceiver which forms part of the NMR system of FIG. 1.

Referring particularly to FIGS. 1 and 2, the transceiver 122 includes components which produce the RF excitation field $B_1$ through RF power amplifier 123 at a coil 138A and components which receive the resulting NMR signal induced in a coil 138B. The base, or carrier, frequency of the RF excitation field is produced by a frequency synthesizer 200 which receives a set of digital signals (CF) through the data communication link 103 from the main computer 101. These digital signals indicate the frequency (e.g. 63.86 MHz) and the relative transmit to receive phase of the RF carrier signal which is produced at an output 201. The commanded RF carrier is applied to a modulator 202 where it is modulated in response to a signal R(t) received through link 103 from the PCM 120. The signal R(t) defines the envelope of the RF excitation pulse to be produced. It is produced in the PCM 120 by sequentially reading out a series of stored digital values, that represent the desired envelope, as the RF excitation pulse is generated. These stored digital values may, in turn, be changed by the computer 100 to enable any desired RF pulse envelope to be produced. The magnitude of the RF excitation pulse output through line 205 is attenuated by a transmit attenuator circuit 206 which receives a digital signal, TA, from the main computer 101 through data communication link 103. The attenuated RF excitation pulses are applied to the power amplifier 123 that drives the RF transmitter coil 138A.

The NMR signal produced by the patient is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal contains patient image information within a 125 kHz band of frequencies centered at or around the Larmor frequency, which in the exemplary embodiment of the present invention is 63.86 MHz. One should recognize that the primary image information of interest typically lies in a narrower band within this 125 kHz band of frequencies. The received high frequency signal is filtered and demodulated in a two step process in a demodulator 208. First the NMR signal is filtered and mixed with a carrier signal on line 201, that is 2.6875 MHz above the frequency center of the image information, and the resulting difference signal is filtered and mixed with the 2.5 MHz reference signal on line 204. The resultant demodulated NMR signal on line 212 has a maximum bandwidth of 125 kHz and it is centered at a frequency of 187.5 kHz. This signal is further filtered and applied to the input of an analog-to-digital (A/D) converter 209 which samples and digitizes the analog signal at a rate of 250 kHz. The output of the A/D converter 209 is applied to a digital quadrature detector 210 which produces a 32-bit in-phase (I) value and a 32-bit quadrature (Q) value corresponding to alternate received digital samples. The resulting stream of digital I and Q values of the received NMR signal is output through data link 105 to the array processor 106 where they are employed to reconstruct an image.

To insure the phase consistency in the received NMR signals in multiple imaging sequences, both the modulator 202 in the transmitter section and the demodulator 208 in the receiver section are operated with common or digitally controlled signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes of the demodulated received NMR signal accurately indicate the phase changes experienced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201.

Figure 3:
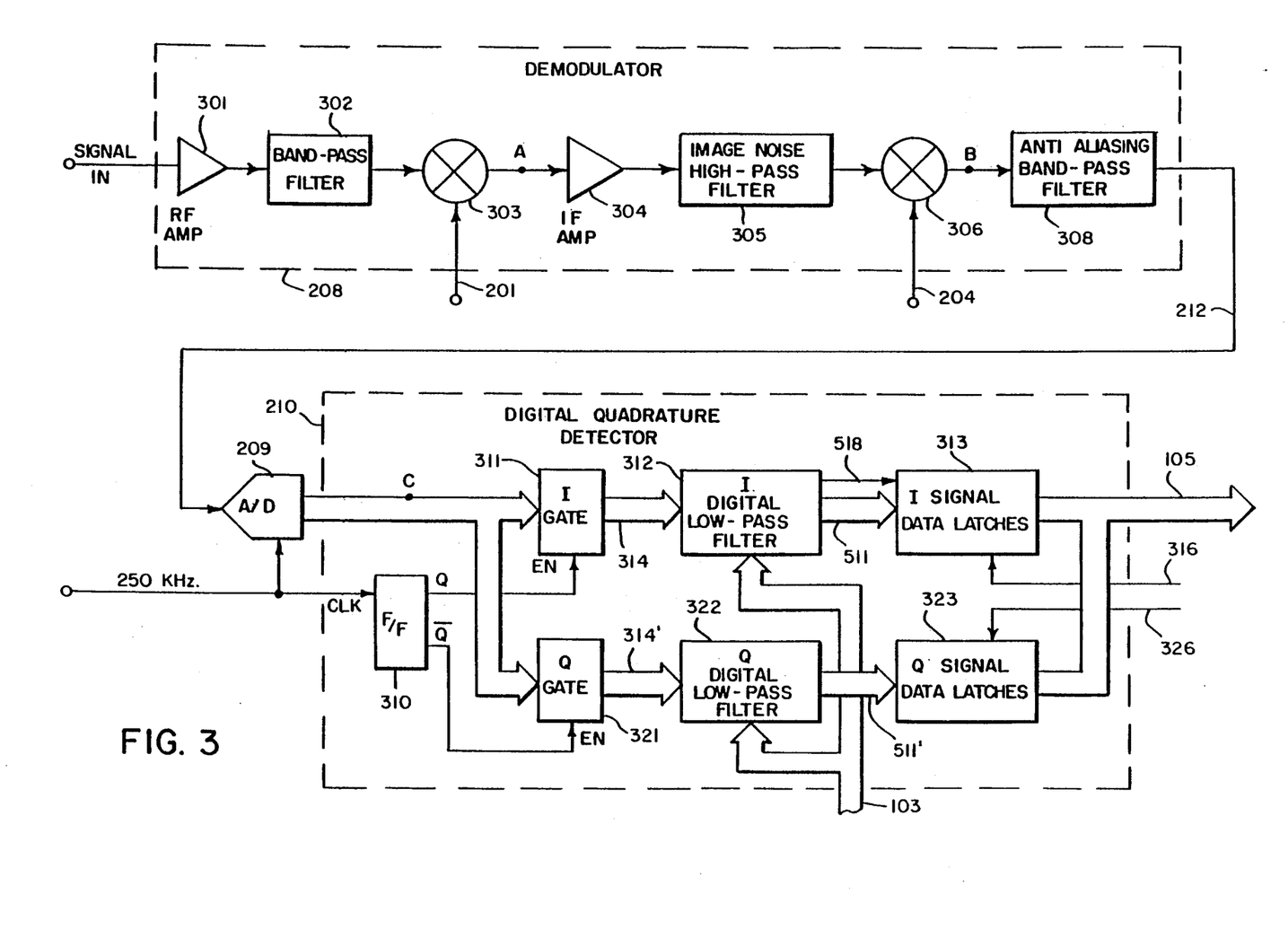
FIG. 3 is an electrical block diagram of the received signal processor components in the transceiver of FIG. 2.

With reference to FIG. 3, the signal from of the receiver and attenuator 207 is applied to an RF amplifier 301 in the demodulator 208. The output of the RF amplifier 301 is coupled to the input of a band-pass filter 302 which passes a one MHz band of frequencies that is centered at 63.86 MHz and which has a 30 db rejection of frequencies outside this band. For example, this filter may be a model 4LB32 manufactured by K & L Microwave, Inc. that is adjusted to the proper frequency response. The purpose of the band-pass filter 302 is to remove any noise outside a one MHz band of frequencies in which lies the 125 kHz band containing the NMR image information. This filtration insures that the noise will not be introduced into the signal next produced by heterodyning the image information signal with a reference frequency signal. Alternatively, a low-pass filter with the proper frequency response can be used in place of band-pass filter 302.

Figure 4A:
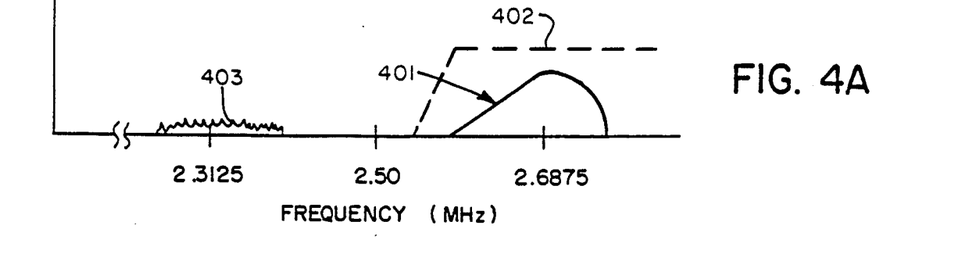
FIGS. 4A, 4B, 4C, and 4D are waveforms of the received signal at different stages of processing.

In the receive mode, the frequency synthesizer 200 is adjusted to produce modified carrier signal on line 201 at 66.5475 MHz. The frequency of the carrier signal during the receive mode is 2.6875 MHz higher than the center of the input RF signal's frequency band of interest. It is chosen so that the image information will be centered at 1.5 times its maximum bandwidth (125 kHz)in the demodulator output signal on line 212, as will be described. The modified carrier signal is heterodyned with the output of the band-pass filter 302 in a first mixer 303. This mixing generates a first intermediate frequency (I.F.) signal at node A with the image information 401 contained in a 125 kHz band of frequencies centered at 2.6875 MHz, as illustrated in FIG. 4A.

The output of the first mixer 303 is coupled by an I.F. amplifier 304 to a high-pass filter 305. The response of this filter 305 (depicted by the dashed line 402 in FIG. 4A) is selected to remove noise below 2.50 MHz. Of particular concern is the noise and extraneous signals 403 in a band of frequencies centered at 2.3125 MHz, which band is symmetrical about 2.50 MHz with the image information 401. For example, filter 305 can be a model 968 manufactured by Netcom, Inc. with a pass frequency at 2.6873 MHz and having an amplitude response of ±0.1 db throughout a 62.5 kHz band on either side of the pass frequency and a 30 db rejection of frequencies below 2.375 MHz. If the noise and other extraneous signals below 2.50 MHz are not removed from the signal, subsequent heterodyning will superimpose these unwanted signals onto the image information.

Figure 4B:
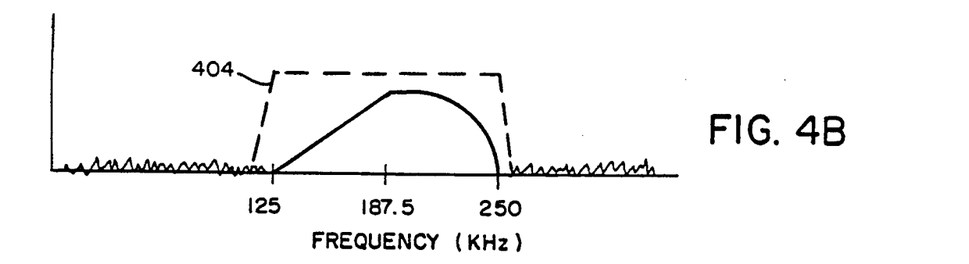
Figure 4C:
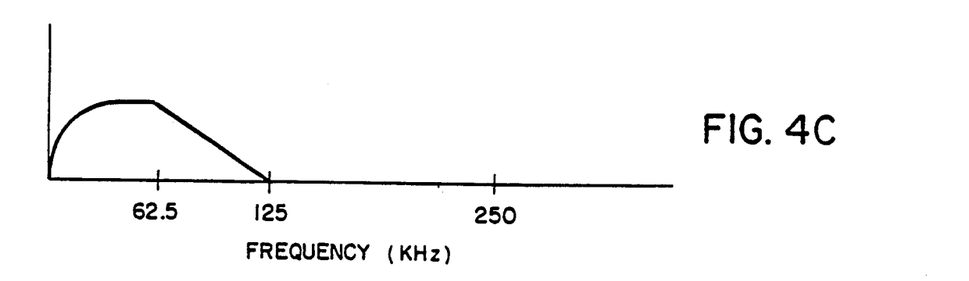
Figure 4D:
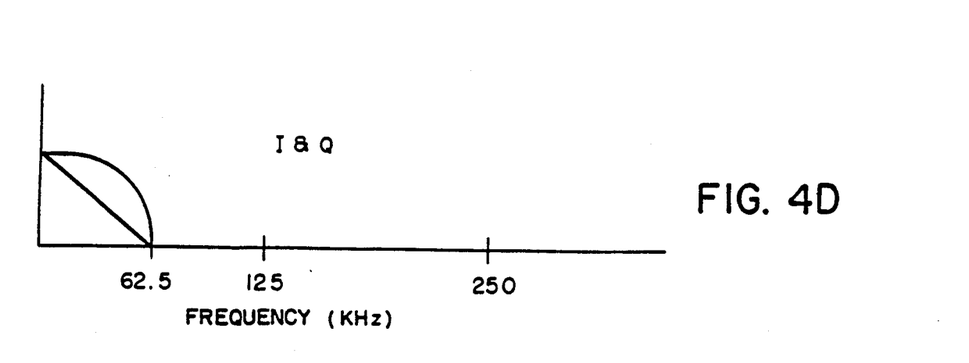

The output of the image noise high-pass filter 305 is applied to one input of a second mixer 306. Another input of the second mixer receives the 2.50 MHz reference signal on line 204 from the reference frequency generator 203. The two signals applied to mixer 306 heterodyne to produce an output signal at node B in which the 125 kHz band of frequencies containing the image information now is centered at 187.5 kHz, as illustrated in FIG. 4B.

The resultant signal from the second mixer 306 is coupled to an anti-aliasing band-pass filter 308. The response of this filter 308 is represented by the dashed trapezoid 404 in Figure 4B and is selected to remove noise from the signal at frequencies above and below the band of image information frequencies. The frequency response of filter 308 is substantially flat for frequencies in the 125 kHz band centered at 187.5 kHz and has a 50 db rejection of frequencies beyond 81.25 kHz on either side of the center frequency. For example, this filter may be a model 944 manufactured by Netcom, Inc.

Referring still to FIGS. 3 and 4A-D, the filtered signal is then coupled to the input of the analog to digital converter 209, which periodically samples the signal and produces a digital representation of the signal sample amplitude. The Shannon Sampling Theorem states that the sampling rate must be at least twice the bandwidth of the analog signal. If this is not done, some frequency components of the analog signal will be superimposed, i.e. will be indistinguishable from each other in the sampled data. This phenomenon is called "aliasing". When applied to analog signals, (e.g. a low-pass signal with frequency content between 0 to 250 kHz), this theorem dictates that the sampling rate be at least twice the highest frequency present (i.e. a sampling rate of 500 kHz). However, in the present band-pass case, with a bandwidth equal to half the highest frequency present, the sampling rate need not exceded 250 kHz, as will be further described below.

If the input to analog to digital converter 209 is viewed as a low-pass signal, i.e. 0 to 250 kHz, a sampling rate of 250 kHz undersamples the image information data. This under sampling of the signal intentionally aliases the image information component, reflecting frequencies between 125-250 kHz into the 0-125 kHz band, flipped end-for-end in the frequency direction. The result of the aliasing is depicted graphically by the waveform of FIG. 4C. It should be remembered that the anti-aliasing band-pass filter 308 essentially removed all signal components (e.g. noise) in the 0-125 kHz band, as well as at frequencies above 250 kHz. Therefore, the digitized signal contains information primarily due to the amplitude of the frequency components in the 125-250 kHz band, i.e. the frequencies which contain NMR image information. Without the anti-aliasing filter 308, noise and other signals in the 0-125 kHz band would be superimposed onto the image information by the digitizing process. Because the frequency cutoffs of the anti-aliasing band-pass filter 308 are not step functions, spurious signals just below 125 kHz and just above 250 kHz may not be fully attenuated. However, since the primary image information of interest typically lies in a narrower (e.g. 32 kHz) band centered at 187.5 kHz, these spurious signals will not adversely affect the constructed NMR image.

The demodulator 208 and the analog to digital converter 209 shift the frequency band of the image information to near baseband frequencies and digitize the signal. Although the signal which results from this processing could be used directly by an array processor 106 (see FIG. 1) to construct an image, it is desirable to derive two standard quadrature signals (I and Q) containing the image information in order that a conventional array processor can be utilized.

The remaining portion of FIG. 3 shows the components of the quadrature detector 210. This circuit produces the I and Q quadrature signals from the digitized image information signal and essentially brings the mid-frequency (62.5 kHz) of the digitized signal down to dc level (i.e. zero Hertz in FIG. 4D). The quadrature detector 210 also digitally filters the I and Q signals to remove extraneous frequencies.

The classical quadrature detection technique involves separately mixing every sample from the analog to digital converter 209 with sine and cosine reference signals at the 62.5 kHz mid-band frequency. Since the sampling rate of the analog to digital converter for the image information signal is 250 kHz, the sine and cosine reference signals must also be sampled at that rate to provide digital values by which to multiply the image information samples. The sampling frequency is four times the frequency of the reference signals and has a phase relationship, which produces the following series of digital values for the cosine and sine reference signals:
cosine: 1, 0, −1, 0, 1, 0, −1, 0, . . .
sine: 0, 1, 0, −1, 0, 1, 0, −1, . . .

As can be observed from these numerical series, when the image information signal is multiplied by the cosine and sine reference signals every other product, or term in the resultant I and Q signals, will be zero. As a consequence, part of the quadrature detection can easily be implemented by a pair of gates which alternate passing every other image information signal sample, recognizing that the interleaved zero terms are not present in the gated outputs. That is when the "I" gate is open to pass an image information sample, the "Q" gate is closed; and vice versa. However, every fourth term of both the sine and cosine numerical series is a negative one, which means that every other time that each gate is opened the sample should be inverted, or negated in digital terminology.

Referring still to FIG. 3, the digitized image signal samples from the analog to digital converter 209 are applied to the inputs of two sets of logic gates 311 and 321. The first set of logic gates 311, designated as the I gate, are rendered conductive by a clock signal from the Q output of flip-flop (F/F) 310. The second set of logic gates 321, designated as the Q gate, are rendered conductive by a clock signal from the $\overline{Q}$ output of flip-flop 310. The flip-flop is clocked by the 250 kHz signal that also is applied to the analog to digital converter 209. Since Q and $\overline{Q}$ are complementary signals, each I and Q gate 311 and 321 will be conductive on alternate pulses of the 250 kHz reference signal with only one of them being conductive at any given time. This alternate clocking of the I and Q gate sets performs the quadrature detection, with the exception of negating the sign of every other sample passed. As will be described, this latter function is accomplished by subsequent digital low-pass filters in the quadrature detector 210, which change the sign of every other sample in the I and Q channels.

The outputs of the I and Q signal gates 311 and 321 are coupled to separate low-pass, finite impulse response (FIR) digital filters 312 and 322, respectively. These I and Q low-pass filters are implemented by two identical circuits, which can digitally compute convolution operations with up to 255 taps. As a signal sample is applied to one of the filters 312 and 322, it enters the first stage of an N stage pipeline in which each stage represents a tap of the filter, and with previous samples being shifted one stage down the pipeline. A filter tap coefficient is defined for each stage. When a filter output value is desired, the tap coefficients are multiplied by the signal samples in the corresponding stages. The products of these multiplications are summed to produce the filter output value.

As a result of the function of I and Q gates 311 and 321, the low-pass filters 312 and 322 are presented with all the non-zero data that would result from multiplication of the incoming image information signal samples with the samples cosine and sine reference signals. However, these samples are not in time synchrony. Suppose the gate logic is arranged so that the first sample of the analog to digital converter 209 is passed by the I gate 311 to low-pass filter 312. The corresponding Q data sample would be zero and is not seen by the Q low-pass filter 322. The next sample from the analog to digital converter 209 is passed by Q gate 321 to the Q low-pass filter 322. As a result, the first data point in the I low-pass filter 312 precedes the first data point in the Q low-pass filter 322 by one sampling period. If compensation for this temporal difference is not provided, the outputs of the I and Q filters will not be interpretable as conventional I and Q data pairs, which are typically in time synchrony.

However, compensation for this relative lag of Q data with respect to I data is easily performed as part of the low-pass filtering operation by using different sets of filter coefficients in the I and Q digital filters 312 and 322. Knowledge of the frequency content of the signal output of the anti-aliasing band-pass filter 308 is used to compute FIR filter using known techniques and a sampling rate of 250 kHz. Let these coefficients be $\{f_1, f_2, f_3, \ldots f_N\}$. Conventional digital implementation of quadrature detection and low-pass filtration would be as follows. For the I channel, samples from the analog to digital converter 209 would be multiplied by a cosine reference signal. Simultaneously, digital samples would also be multiplied by a sine reference signal. This parallel multiplication generates a pair of sine and cosine referenced products. At any time that a low-pass filtered I, Q data pair is desired, the N most recent cosine referenced products would be pairwise multiplied by the filter coefficients $\{f_1, f_2, f_3, \ldots f_N\}$ and then summed to produce a filtered I value. Also, the N most recent sine reference products would be pairwise multiplied by the filter coefficients $\{f_1, f_2, f_3, \ldots f_N\}$ and summed to produce a filtered Q value. This I, Q data pair could be used in the conventional manner to construct an NMR image.

However, recall that every other sample of the cosine and sine reference signals is zero, and therefore so are the corresponding cosine and sine referenced products. Thus, half of the values summed in a conventional filtering operation would be zeroes. These needless steps can easily be bypassed.

Suppose that at the time a filtered I, Q data pair is desired the most recent cosine referenced product is non-zero. As is clear by now, only pairwise multiplication of the cosine referenced signals with the odd numbered coefficients in the series $\{f_1, f_2, f_3, \ldots f_N\}$ would have non-zero products. The entire operation is equivalent to using only every other output of the cosine referenced products (the non-zero ones), pairwise multiplying these N/2 values with the alternate coefficients $\{f_1, f_3, f_5, \ldots\}$, and summing the N/2 products. Similarly, only the non-zero sine referenced values need be considered, which are multiplied by the even numbered coefficients $\{f_2, f_4, f_6, \ldots\}$ and the N/2 products then are summed to produce a filtered Q value.

It is seen, then, that the complete digital quadrature demodulation and low-pass filtration can be equivalently accomplished by passing alternate outputs of the analog to digital converter 209 to I and Q circuits, negating every second sample of each, and operating on each I and Q sample set with somewhat different FIR filters. The coefficients for each FIR filter 312 and 322 are simply alternate terms of a conventional FIR filter coefficient series. The simplification in processing results from the fact that the demodulation frequency is one-quarter the sampling frequency, and that the phase of the cosine and sine references was chosen so that their alternate samples are zero.

Figure 5:
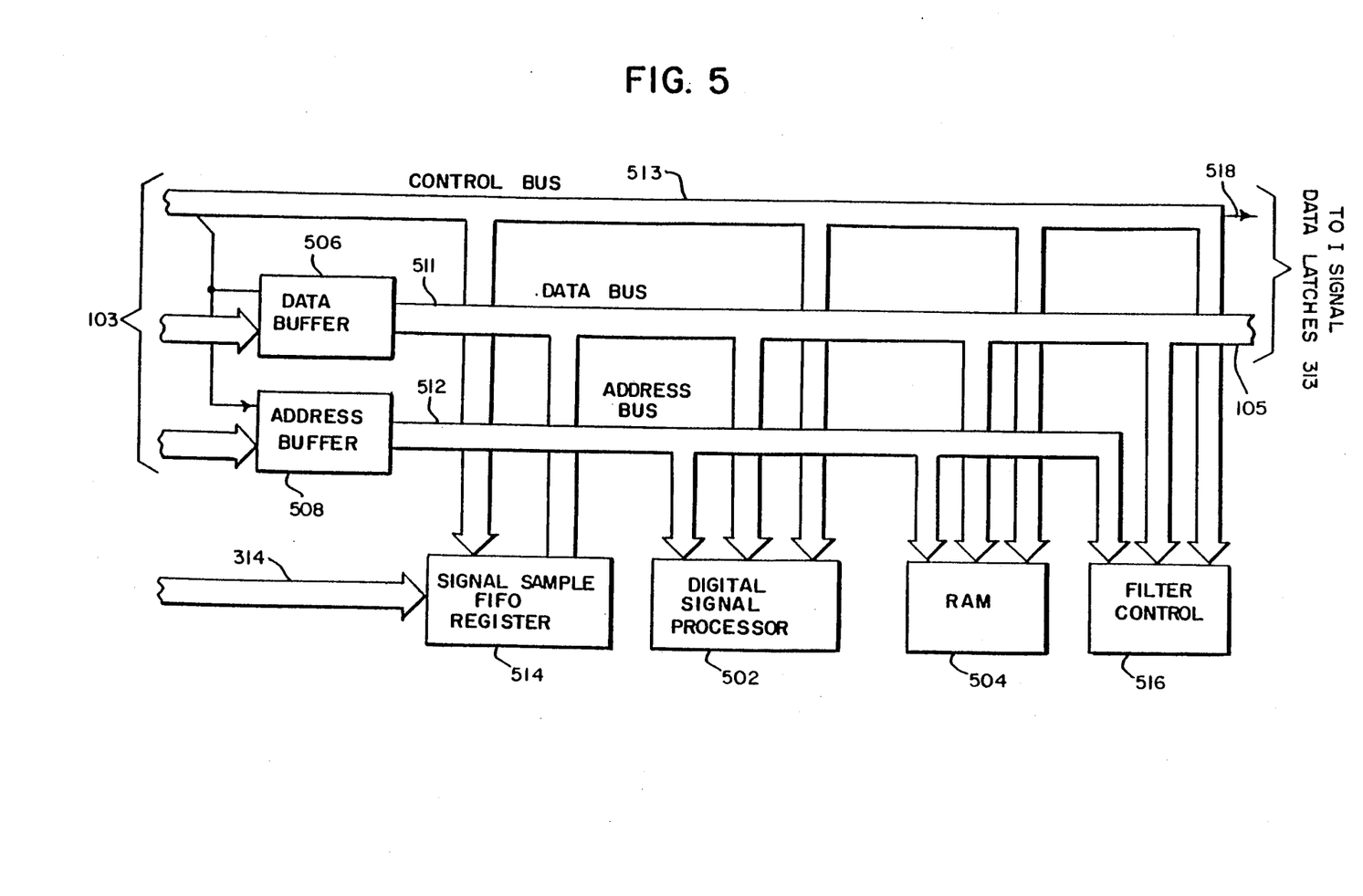
FIG. 5 is an electrical block diagram of a digital filter used to process the received signal.

The I and Q low-pass filters 312 and 322 are implemented by two identical circuits with the circuit for the I signal filter 312 as shown in FIG. 5. The filtering process is performed by a digital signal processor (DSP) 502, such as a TMS320C25 model manufactured by Texas Instruments, Inc. The TMS320C25 digital signal processor contains a 32-bit arithmetic logic unit and accumulator, on-chip memory (RAM and ROM) and external memory access capability. This DSP is a programmable device which enables the I and Q signals to be processed in real-time according to known digital signal processing algorithms. Specifically, the DSP applies digital filter coefficients to the I or Q signal to remove noise and spurious signals at frequencies which do not contain image information. The DSP 502 allows different filter characteristic to be applied to the I signal by software selection of different sets of filter coefficients.

The program executed by the DSP 502 to perform the filtering and the digital filter coefficients used by that program are stored in a random access memory (RAM) 504. The program and coefficients are downloaded over communication link 103 from the main computer system 100 into RAM 504 upon power-up of the NMR imaging system. As noted previously, this link 103 consists of a data bus, an address bus and a control signal bus. The data bus is connected to a set of data buffers 506 which interfaces communication link 103 to a filter data bus 511. The filter's data bus 511 extends to the I data latches 313 so that the output from the filter can be stored in the latches. Similarly, the address bus of the communication link 103 is interfaced to a filter address bus 512 by a set of address buffers 508. The data and address buffers 506 and 508 are enabled by a signal on a line of the control bus 513 when the program and filter coefficients are being downloaded.

The signal samples passed by the I gate 311 are applied via a set of lines 314 to the data inputs of a 512 stage FIFO register 514. The FIFO register 514 provides an asynchronous dual-access register for isolating the I signal gate from the filter data bus 511, thereby enabling the DSP 502 to operate in a uninterrupted manner. When DSP 502 requires an I signal sample, the output from the signal sample FIFO register 514 is coupled to the filter data bus 511 in response to a signal from the control bus 513.

A filter control circuit 518 governs which components are electrically coupled to filter data bus 511 and address bus 512 at any given time. For this purpose, the filter control circuit responds to commands from the DSP 502 by producing control signals on bus 513 for specific components.

The program which is executed by the DSP 502 to perform the digital filtering is written in a conventional manner by standard programming techniques using documentation and program development software available from the manufacturer of the DSP. For example, Texas Instruments, Inc. provides such materials for programming the TMS320C25 model digital signal processor.

Figure 6A:
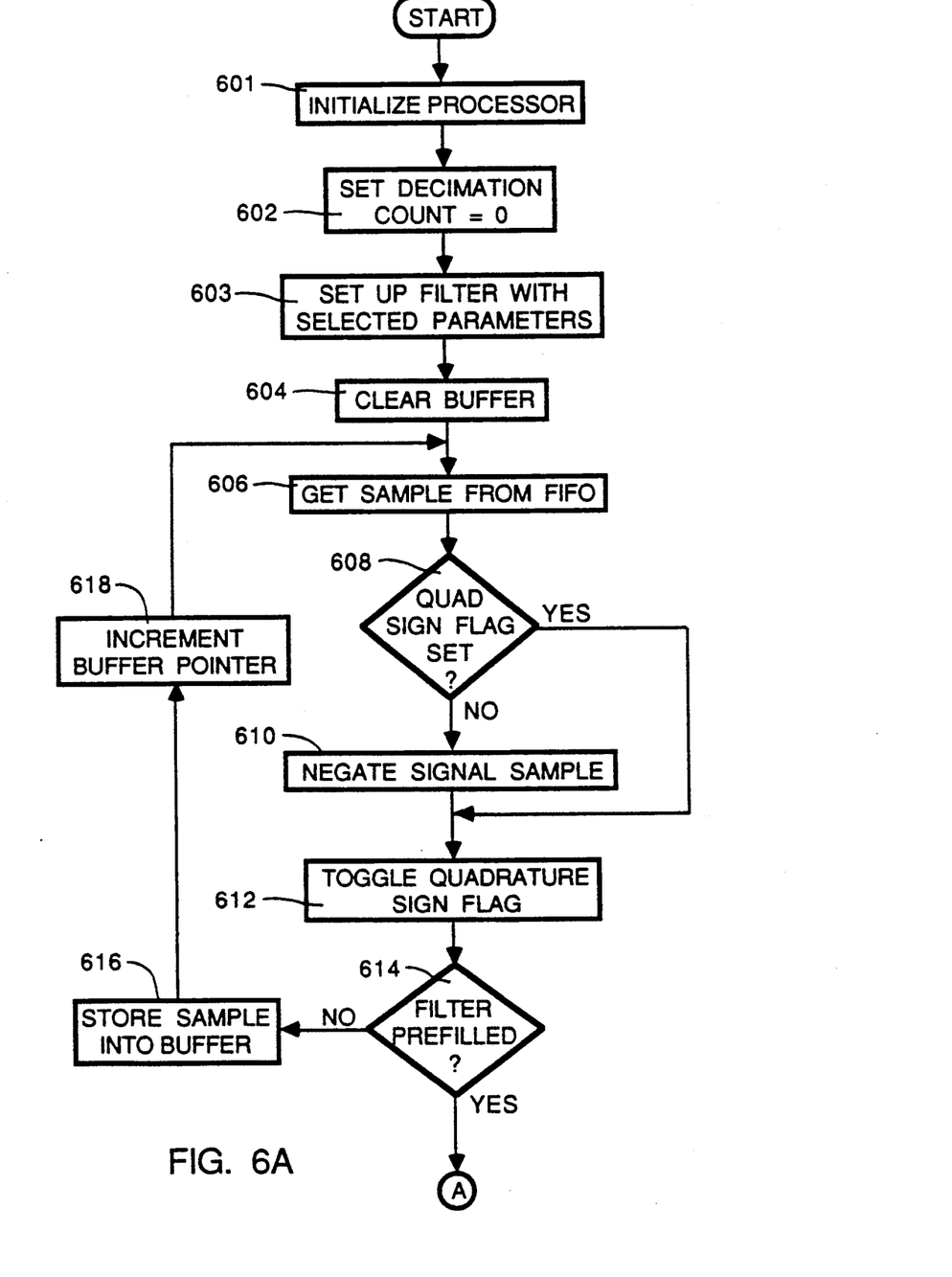
FIGS. 6A and 6B are a flowchart of a filter program for a digital signal processor in the low-pass filter in FIG. 3.
Figure 6B:
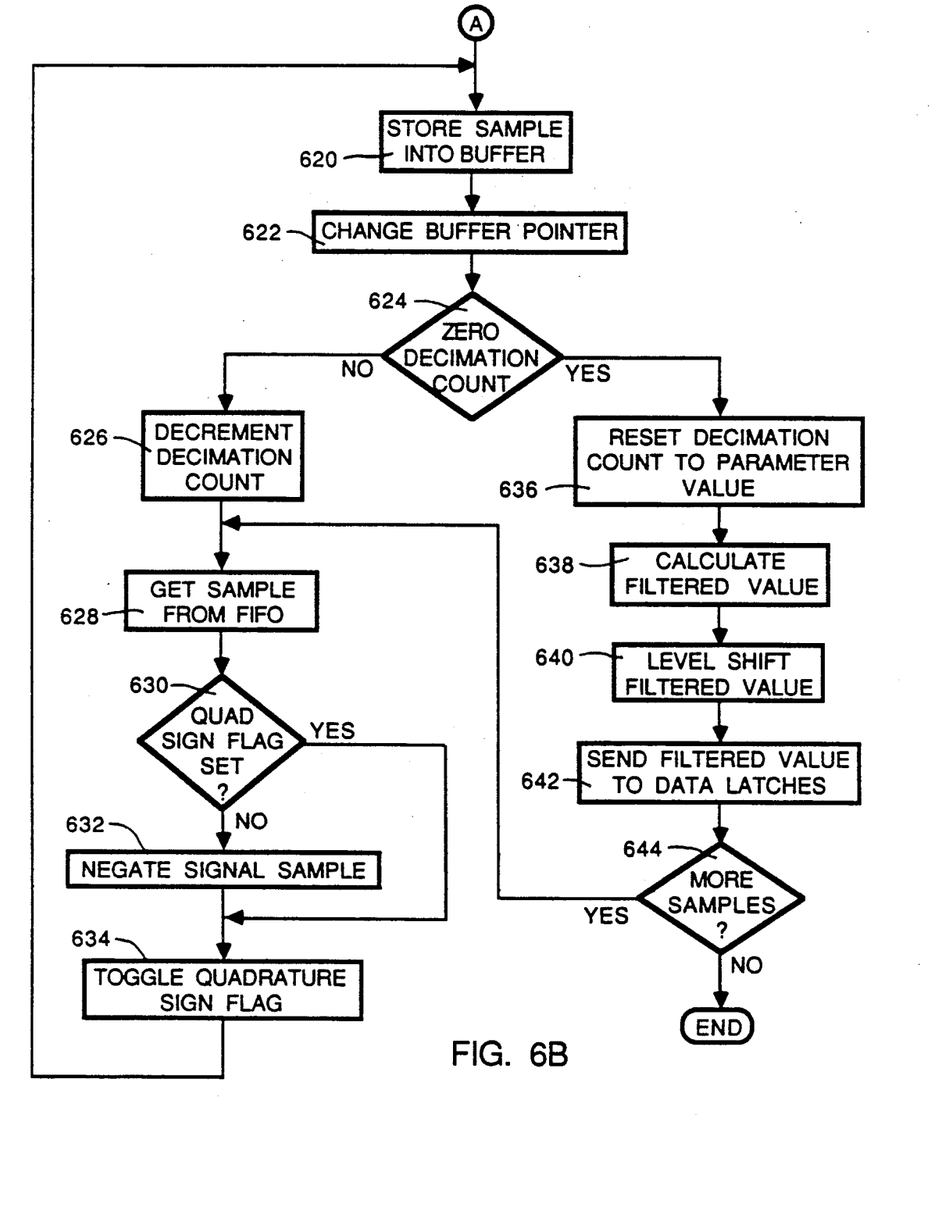

The digital signal processor program is depicted by the flowchart in FIGS. 6A and 6B. The program begins an execution cycle when the DSP 502 receives a signal indicating that a new NMR data frame is being processed. In the first step 601 of the filtering process, the DSP is initialized. The filter may be configured to decimate the amount of signal data by requiring the input of a given number of signal samples into the filter before each output value is produced. At step 602, a decimation count of input signal samples used by this function is zeroed. Data, previously received from the computer system 100, are then used at step 603 to configure the filter by selecting one of several sets of filter tap coefficients stored in RAM 504, the decimation amount and other parameters. An internal DSP buffer, which stores the I signal samples for each tap of the filter, is cleared of any residual samples from the previous data frame at step 604.

The digital signal processor 502 then issues a control signal to read the first signal sample from the FIFO register 514 at step 606. As noted previously, every other image information signal sample passed by the set of I gates 311 should be negated, but the I gates can not perform that negation. Therefore, a quadrature sign flag is tested at step 608 to determine if the current sample should be negated. If the flag is set to a high logic level, the program execution jumps to step 612. However, if the quadrature sign flag has a low logic level, the sign of the signal sample is changed at step 610. Then the quadrature sign flag is toggled at step 612 to indicate whether the next I signal sample should be negated. Alternatively, the negation here and at steps 630–634 can be accomplished by negating the proper filter coefficients stored in RAM 504.

Prior to computing an output value for the filter, half of the filter taps (e.g. 128 taps for a 255 tap filter) must be prefilled with signal samples. At step 614, a counter is checked by the DSP 502 to determine if half of the filter taps have been prefilled. If the prefilling is not complete, the program execution branches to step 616 where the current signal sample is stored in the location of a sample buffer within the internal memory of the DSP, which location is indicated by a pointer. The buffer pointer is incremented at step 618 before the program execution returns to step 606 where another signal sample is obtained from the FIFO register 514. The program execution continues to loop through steps 606-618 until half of the taps of the filter have been prefilled.

At this time, the program advances from step 614 to step 20 where the current I signal sample is stored in the filter buffer. Then, at step 622, the buffer pointer is changed to indicate the address of the last buffer storage location, thereby pointing to the oldest sample in the buffer. However, since only half of the taps have been prefilled, initially the last buffer location will contain a zero value. Because physically shifting the samples within the buffer is a time consuming operation, the signal samples are stored in a ring of storage locations within the buffer. As a new sample is fed to the filter, it overwrites the oldest sample as indicated by the pointer at step 620 and the pointer is changed to the next oldest sample around the ring at step 622. As will be described, in applying the tap coefficients to the stored samples, the coefficient for the last filter tap is applied to the sample indicated by the pointer, and each subsequent tap coefficient is applied to the next storage location around the buffer ring.

At step 624, the DSP 502 checks the decimation count stored in its memory to determine whether the count equals zero. As noted previously, the signal data may be decimated by inputting a given number of signal samples into the filter for each output value that is produced. This given number of input samples is indicated by a decimation parameter stored in RAM 04, which is used to reset the decimation count. If the decimation count is a non-zero value, an output of the filter is not calculated. Instead the program branches to step 626 where the decimation count is decremented. The program then advances to step 628 where the next I signal sample is obtained from the FIFO register 514. As with the prefill samples, every other sample has to be negated. At step 630 the quadrature sign flag is tested and if necessary, the sample is negated at step 632. The flag is then toggled at step 634 before the program execution returns to step 620 to store the sample.

The program continues to loop through steps 620–634 until the decimation count is zero, at which time the execution branches to step 636 where the decimation count is reset to the parameter value. Then the digital signal processor 502 calculates a filter output value at step 638 by multiplying each filter tap coefficient by the signal sample stored in the buffer location for the corresponding tap. The products of the multiplication for each tap are summed to provide a digital output value for the filter. If necessary, the level of the digital output value may be shifted at step 640 according to a parameter supplied by the computer system 100 during set-up of the filter.

At step 642, the computed output value for the filter 312 is applied by the DSP 502 to the filter data bus 511, and an input enable signal is set via line 518 of the filter control bus 513 to the I signal data latches 313. This input enable signal causes the data latches 313 to store the filter output value then present on data bus 511.

The DSP 502 then determines if another signal sample exists in the FIFO register 514 at step 644. If such a sample is found, the program execution branches to step 628 to obtain and process the sample. The filtering process repeats until all of the signal samples have been filtered at which point the program ends.

With reference to FIGS. 1 and 3, as the digital output values from the I and Q digital low-pass filters 312 and 322 are stored in the sets of data latches 313 and 323, the pairs of I and Q values are selectively read over data link 105 by the array processor 106. A signal on control lines 316 and 326 from the array processor 106 enables the output from I and Q data latches 313 and 323, respectively. The data latches are FIFO devices which enable the I and Q values to be buffered. This buffering allows the array processor 106 to work asynchronously of the I and Q circuits.

We claim:

1. A receiver for processing an electrical signal in a medical imaging apparatus which receives an input signal containing frequency modulated image information in a range of frequencies contained within a frequency band having a bandwidth BW, the receiver comprising:
    means for demodulating the input signal to produce a resultant signal in which the image information from the input signal lies within a band of frequencies centered at a frequency which is substantially 1.5 times the bandwidth BW; and
    an analog to digital converter for sampling the resultant signal at ar ate substantially equal to twice the bandwidth BW and converting the samples into a digital signal.

2. The receiver as recited in claim 1 further comprising a quadrature detector which produces two output signals I and Q from the digital signal of the analog to digital converter, the I signal being a component of the resultant signal which is in phase with a reference signal having a frequency that is one-fourth the bandwidth BW, and the Q signal being a component of the resultant signal which is ninety degrees out of phase with the reference signal.

3. The receiver as recited in claim 2 wherein said quadrature detector comprises means for selecting every other signal sample for producing the I signal; and means for selecting signal samples, which are not selected for the I signal, to produce the Q signal.

4. The receiver as recited in claim 2 wherein said quadrature detector comprises means for selecting every nth sample starting with sample m to produce the I signal, where m and n are integers; and means for selecting every nth sample starting with the $m+(n/2)$ sample to produce the Q signal.

5. The receiver as recited in claim 2 further comprising means for digitally filtering the I and Q signals to reject frequencies above the band of frequencies which contain the information.

6. The receiver as recited in claim 1 wherein said means for demodulating comprises:
    a first means for heterodyning the received signal with a first reference signal to shift the image information to a band of frequencies centered at a first intermediate frequency thereby producing an intermediate frequency signal; and
    a second means for heterodyning the intermediate frequency signal with a second reference signal to produce the resultant signal in which the image information is shifted to a band of frequencies centered at frequency which is substantially 1.5 times the bandwidth BW.

7. The receiver as recited in claim 1 further comprising means for filtering the resultant signal before that signal is applied to said analog to digital converter, said means for filtering having a band-pass substantially equal to the band of frequencies which contain the information.

8. A radio frequency receiver for a medical imaging apparatus which processes an input signal containing image information in a band of frequencies having a bandwidth BW comprising:
    an analog to digital converter for sampling the input signal at a frequency f and converting the signal samples into digital form, the resulting digital signal samples being ordinally numbered;
    means for generating first and second secondary signals from the digital signal samples wherein one of the secondary signals is a component of the input signal which is in phase with a reference signal having a frequency f/4 and the other secondary signal is a component of the input signal which is ninety degrees out of phase with the reference signal, said means for generating the two secondary signals including:
(a) means for selecting even numbered digital signal samples to produce the first secondary signal and for selecting odd numbered digital signal samples to produce the second secondary signal; and
(b) means for negating every other digital signal sample selected for each of the first and second secondary signals.

9. The receiver as recited in claim 8 wherein said means for selecting comprises:
a first gate means which receives the digital signal samples at an input and passes a digital signal sample to an output upon being enabled by a first clock signal;
a second gate means which receives the digital signal samples at an input and passes a digital signal sample to an output upon being enabled by a second clock signal; and
means for producing the first and second clock signals in response to a signal having a frequency f.

10. The receiver as recited in claim 8 wherein said means for negating comprises a separate digital low-pass filter means for each of the two secondary signals.

11. The receiver as recited in claim 8 further comprising a means for demodulating a radio-frequency signal to produce the input signal in which the band of frequencies containing the image information is centered at frequency which is substantially 1.5 times the bandwidth BW.

12. The receiver as recited in claim 9 wherein the frequency f at which said analog to digital converter for samples the input signal is twice the bandwidth BW.

13. A magnetic resonance imaging system receiver, which processes an input signal containing image information in a band of frequencies having a bandwidth BW, comprising:
a first filter which rejects frequencies in the input signal that are above the frequency of a first reference signal;
a first means for heterodyning a signal from the first filter with the first reference signal to shift the image information into a band of frequencies centered at a first intermediate frequency, thereby producing a first intermediate signal;
a second filter which rejects the frequencies in the first intermediate signal that are outside a band of frequencies which contain the image information;
a second means for heterodyning a signal from said second filter with a second reference signal to produce a second intermediate signal in which the image information is shifted into a band of frequencies centered at a frequency that is substantially 1.5 times the bandwidth BW;
a third filter which rejects the frequencies in the second intermediate signal that are outside a band of frequencies which contain the image information; and
an analog to digital converter means for sampling a signal from said third filter at a rate substantially equal to twice the bandwidth BW and converting the samples into a digital signal.

14. The receiver as recited in claim 13 further comprising a quadrature detector which produces two output signals I and Q from the digital signal of the analog to digital converter, the I signal being a component of the digital signal which is in phase with a reference signal having a frequency that is one-fourth the bandwidth BW, and the Q signal being a component of the digital signal which is ninety degrees out of phase with the reference signal.

15. The receiver as recited in claim 14 wherein said quadrature detector comprises:
means for selecting every other digital signal sample to produce the I signal, and for selecting the digital signal samples which are not selected for the I signal to produce the Q signal; and
means for negating every other digital signal sample selected for the I signal, and for for negating every other digital signal sample selected for the Q signal.

16. The receiver as recited in claim 14 further comprising means for filtering the I and Q signals to reject frequencies above the band of frequencies which contain the image information.

* * * * *